(12) United States Patent
Taras et al.

(10) Patent No.: US 9,429,151 B2
(45) Date of Patent: Aug. 30, 2016

(54) VARIABLE FREQUENCY DRIVE HEAT SINK ASSEMBLY

(75) Inventors: Michael F. Taras, Fayetteville, NY (US); KeonWoo Lee, Manlius, NY (US); Mark J. Perkovich, Fayetteville, NY (US); Suresh Duraisamy, Liverpool, NY (US); XuQiang Liao, Manlius, NY (US); Claus E. Jorgensen, Egernsund (DK); Arne F. Hansen, Graasten (DK)

(73) Assignee: CARRIER CORPORATION, Farmington, CT (US)

( * ) Notice: Subject to any disclaimer, the term of this patent is extended or adjusted under 35 U.S.C. 154(b) by 324 days.

(21) Appl. No.: 14/117,404

(22) PCT Filed: Apr. 20, 2012

(86) PCT No.: PCT/US2012/034386
§ 371 (c)(1),
(2), (4) Date: Jun. 20, 2014

(87) PCT Pub. No.: WO2012/158304
PCT Pub. Date: Nov. 22, 2012

(65) Prior Publication Data
US 2014/0298846 A1 Oct. 9, 2014

Related U.S. Application Data

(60) Provisional application No. 61/487,078, filed on May 17, 2011.

(51) Int. Cl.
*F04B 39/06* (2006.01)
*H05K 7/20* (2006.01)

(52) U.S. Cl.
CPC ........... *F04B 39/06* (2013.01); *H05K 7/20918* (2013.01)

(58) Field of Classification Search
CPC .......................... F04B 39/06; H05K 7/20918
USPC .......... 62/259.2, 291, 467; 165/104.33, 185; 361/388, 384
See application file for complete search history.

(56) References Cited

U.S. PATENT DOCUMENTS 3,811,623 A * 5/1974 Speer ...................... B02C 19/18
241/1
4,062,777 A * 12/1977 Tsuruta .............. B01D 53/0423
210/264

(Continued)

FOREIGN PATENT DOCUMENTS

EP 1915047 A2 4/2008
WO 2012158304 A1 11/2012

OTHER PUBLICATIONS

Notification of Transmittal of the International Preliminary Report on Patentability of the International Searching Authority, or the Declaration; PCT/US2012/034386; Nov. 19, 2013.

(Continued)

*Primary Examiner* — Mohammad M Ali
(74) *Attorney, Agent, or Firm* — Cantor Colburn LLP

(57) ABSTRACT

A heat sink assembly is disclosed for cooling a power electronics module, such as a variable frequency drive. The heat sink assembly includes a housing and a heat sink structure. The housing defines an interior chamber for enclosing the power electronics module and also defines a cooling air flow channel exterior to the interior chamber. The heat sink structure is disposed in conductive heat transfer relationship with the interior chamber and has a heat transfer surface positioned within the exterior cooling air flow channel in convective heat transfer relationship with the cooling air flow.

22 Claims, 3 Drawing Sheets

(56) References Cited

U.S. PATENT DOCUMENTS

| | | | | |
|---|---|---|---|---|
| 4,520,425 | A | | 5/1985 | Ito |
| 4,648,007 | A | * | 3/1987 | Garner ............... H05K 7/20572 165/101 |
| 4,769,557 | A | * | 9/1988 | Houf .................... H05K 7/1432 307/147 |
| 4,908,738 | A | * | 3/1990 | Kobari ................. H02M 7/003 361/757 |
| 5,012,173 | A | * | 4/1991 | Fujioka ................ H05K 7/1432 318/727 |
| 5,034,124 | A | * | 7/1991 | Kopf .................... B01D 25/215 210/231 |
| 5,107,398 | A | * | 4/1992 | Bailey ...................... G06F 1/20 165/104.33 |
| 5,138,521 | A | * | 8/1992 | Watanabe .............. H05K 7/209 174/16.3 |
| 5,440,450 | A | * | 8/1995 | Lau ........................... G06F 1/20 361/695 |
| 5,953,209 | A | * | 9/1999 | Chiu .................. H05K 7/20154 361/697 |
| 6,104,602 | A | * | 8/2000 | Morris ................. H05K 7/1432 165/185 |
| 6,116,040 | A | | 9/2000 | Stark |
| 6,560,980 | B2 | | 5/2003 | Gustafson et al. |
| 6,688,124 | B1 | | 2/2004 | Stark et al. |
| 7,246,500 | B2 | | 7/2007 | Singh et al. |
| 7,626,818 | B2 | * | 12/2009 | Yoshida ............. H05K 7/20909 361/679.48 |
| 7,773,369 | B2 | * | 8/2010 | Dornauer ................... H02P 1/04 318/370 |
| 7,881,045 | B2 | * | 2/2011 | Pispa ................. H05K 7/20918 361/622 |
| 7,898,807 | B2 | * | 3/2011 | Beaupre ............. H01L 23/3735 165/80.4 |
| 7,946,123 | B2 | * | 5/2011 | Tolbert, Jr. ............ F25B 49/025 62/228.4 |
| 8,276,394 | B2 | * | 10/2012 | Heydari ..................... G06F 1/20 62/107 |
| 8,289,709 | B2 | * | 10/2012 | Feltner ............... H05K 7/20909 165/104.33 |
| 8,611,088 | B2 | * | 12/2013 | Barna ................. H05K 7/20145 165/104.33 |
| 2001/0003548 | A1 | * | 6/2001 | Straub ................. F16C 33/4623 384/580 |
| 2002/0108743 | A1 | * | 8/2002 | Wirtz ..................... F28F 13/003 165/185 |
| 2003/0148653 | A1 | * | 8/2003 | Thyzel .................... H05K 1/056 439/487 |
| 2004/0226821 | A1 | * | 11/2004 | Schasfoort .............. F04B 19/06 204/600 |
| 2004/0237554 | A1 | * | 12/2004 | Stark ..................... F25B 31/006 62/230 |
| 2005/0105277 | A1 | * | 5/2005 | Frisch ................. H01L 23/3677 361/716 |
| 2005/0118485 | A1 | * | 6/2005 | Tawfik ................ H01M 8/0202 429/457 |
| 2005/0219315 | A1 | * | 10/2005 | Hori ........................ B41J 2/155 347/42 |
| 2005/0257548 | A1 | * | 11/2005 | Grassmuck ........... A47F 3/0447 62/246 |
| 2006/0059937 | A1 | * | 3/2006 | Perkins ..................... F02C 6/16 62/259.2 |
| 2006/0066156 | A1 | * | 3/2006 | Dong ....................... H02K 9/20 310/54 |
| 2006/0179676 | A1 | * | 8/2006 | Goldberg ................ D06F 25/00 34/77 |
| 2007/0188995 | A1 | | 8/2007 | Franz et al. |
| 2007/0227168 | A1 | * | 10/2007 | Simmons ................. F24F 1/027 62/229 |
| 2007/0236883 | A1 | * | 10/2007 | Ruiz ..................... H01L 23/473 361/699 |
| 2008/0047688 | A1 | * | 2/2008 | Ebigt ..................... F28D 7/0025 165/80.2 |
| 2008/0084671 | A1 | * | 4/2008 | Stahlhut ............... H05K 1/0203 361/710 |
| 2008/0247139 | A1 | * | 10/2008 | Stahlhut ............... H05K 1/0203 361/709 |
| 2008/0277261 | A1 | * | 11/2008 | Paxton ................. B01D 1/0041 202/180 |
| 2009/0101307 | A1 | * | 4/2009 | Kumar ................ H01L 23/3672 165/80.3 |
| 2009/0139693 | A1 | * | 6/2009 | Qu .......................... F28F 3/048 165/80.4 |
| 2009/0176144 | A1 | * | 7/2009 | Weng .................. H01M 8/0241 429/479 |
| 2009/0194265 | A1 | * | 8/2009 | Nakamura ......... F02M 25/0737 165/149 |
| 2009/0195983 | A1 | * | 8/2009 | Reichert .................. G06F 1/203 361/697 |
| 2009/0236086 | A1 | * | 9/2009 | Higashiyama .......... F25B 39/02 165/176 |
| 2010/0101242 | A1 | * | 4/2010 | Froelich ................. B64D 13/08 62/56 |
| 2010/0181886 | A1 | | 7/2010 | Hsu et al. |
| 2010/0202109 | A1 | | 8/2010 | Zheng |
| 2010/0236754 | A1 | | 9/2010 | Liu et al. |
| 2011/0056651 | A1 | | 3/2011 | Monk et al. |
| 2011/0083450 | A1 | * | 4/2011 | Turner .................. F25B 31/004 62/56 |

OTHER PUBLICATIONS

Notification of Transmittal of the International Search Report and the Written Opinion of the International Searching Authority, or the Declaration; PCT/US2012/034386; Sep. 28, 2012.

* cited by examiner

VARIABLE FREQUENCY DRIVE HEAT SINK ASSEMBLY

CROSS-REFERENCE TO RELATED APPLICATION

Reference is made to and this application claims priority from and the benefit of U.S. Provisional Application Ser. No. 61/487,078, filed May 17, 2011, and entitled VARIABLE FREQUENCY DRIVE HEAT SINK ASSEMBLY, which application is incorporated herein in its entirety by reference.

BACKGROUND OF THE INVENTION

This invention relates generally to the cooling of a variable frequency drive and, more particularly, to the cooling of a variable frequency drive associated with a refrigerant vapor compressor of a transport refrigeration unit.

Power electronic devices are commonly used for controlling and/or manipulating the characteristics, for example the frequency and/or the voltage, of the electric power being supplied to a variety of electrically powered devices. For example, variable frequency drives are commonly used in connection with variable speed motors for controlling the speed of the motor. Variable speed motors are used in connection with compressors, water pumps, fans and other devices. For example, refrigerant vapor compressors, such as, but not limited to scroll compressors, reciprocating compressors and screw compressors, to enable driving the compression mechanism of the compressor at various operating speeds. As the operating speed of the compression mechanism is decreased, the output capacity of the compressor is decreased, and conversely as the operating speed of the compression mechanism is increased, the output capacity of the compressor is increased. The variable frequency drive is operative to vary the frequency of the electric power supplied to drive motor of the compressor, thereby varying the operating speed of the motor, and consequently the operating speed and output capacity of the compressor.

Transport refrigeration units are commonly used in connection with transport containers for maintaining the cargo box wherein a perishable cargo, such as for example, but not limited to, fresh produce, is stowed at a temperature within a specified temperature range to maintain freshness and minimize spoilage during transit. The transport refrigeration unit includes a refrigerant vapor compressor and condenser/gas cooler disposed externally of the cargo box and an evaporator disposed within the enclosed space of the cargo box. The compressor, condenser/gas cooler and evaporator are connected in a refrigerant circuit in series refrigerant flow relationship in a refrigeration cycle. When the refrigeration unit is operating, air is drawn from within the cargo box, passed through an evaporator in heat exchange relationship with the refrigerant circulating through the refrigerant circuit thereby cooling the air, and the air is supplied back to the cargo box.

To achieve precise temperature control while maintaining system operational efficiency, it is necessary to vary the refrigeration output capacity of the refrigeration unit in response to the refrigeration load demand. For example, during temperature pulldown after exposure of the cargo box to ambient temperature such as during loading of cargo into the cargo box, the compressor of the refrigeration unit is typically operated at maximum output capacity. However, during long periods of operation in a temperature maintenance mode following pulldown, the compressor of the refrigeration unit is operated at low capacity, and often at near zero capacity.

One method of varying the refrigeration capacity of the refrigeration unit is to vary the speed of the compressor using a variable frequency drive as discussed previously to modify the frequency of the electric power being supplied to the electric motor driving the compressor. However, employing a variable frequency drive in controlling compressor speed in connection with a transport refrigeration unit presents a challenge in adequately cooling the power electronics of the variable frequency drive to maintain the reliability and the functionally of the variable frequency drive. This challenge is even more complex for transport refrigeration applications, where operational environments, cargo cooling demands and power electronics heat output vary over a wide spectrum.

SUMMARY OF THE INVENTION

In an aspect, a variable frequency drive heat sink assembly is provided for housing the power electronics of the variable frequency drive at a temperature below a specified threshold temperature at all ambient conditions and power consumption levels.

In an aspect, a variable frequency drive heat sink assembly is provided for housing the power electronics of the variable frequency drive in a sealed enclosure to protect the power electronics from exposure to potentially corrosive ambient conditions.

In an aspect, a variable frequency drive heat sink assembly is provided having a housing through which a flow of cooling air is directed over and across a heat sink structure associated with the power electronics of the variable frequency drive isolated in an enclosed chamber within the housing.

A heat sink assembly is disclosed for cooling a power electronics module. The heat sink assembly includes a housing and a heat sink structure. The housing defines an interior chamber for enclosing the power electronics module and also defines a cooling air flow channel exterior to the interior chamber. The heat sink structure is disposed in conductive heat transfer relationship with the interior chamber and has a heat transfer surface positioned within the exterior cooling air flow channel. A fan is disposed in operative association with the housing for passing a flow of cooling air through the exterior channel across and over the heat transfer surface. The heat transfer surface of the heat sink structure is thus disposed in convective heat transfer relationship with the flow of cooling air whereby heat is removed from the interior chamber through the external heat transfer surface while isolating the power electronics module from the flow of cooling air.

The external heat transfer surface may include a plurality of external heat transfer fins extending outwardly from the housing into the exterior flow channel. The plurality of external heat transfer fins may extend outwardly from a base portion of the heat sink structure disposed in conductive heat transfer relationship with said interior chamber to a tip portion. The plurality of external heat transfer fins may be disposed in spaced relationship thereby defining a plurality of flow subchannels within the flow channel. In an embodiment, the plurality of external heat transfer fins may have an arcuate contour in longitudinal expanse. To facilitate drainage of condensate from the heat transfer fins, a plurality of condensate drain troughs may be formed in the plurality of external heat transfer fins. The plurality of external heat transfer fins may be formed integral with the housing.

In an embodiment, the heat sink assembly constitutes a variable frequency drive heat sink assembly that includes a variable frequency drive module, a housing that defines an interior chamber for enclosing the variable frequency drive and also defines a flow channel exterior to the interior housing, a heat sink structure disposed in conductive heat transfer relationship with the interior chamber and having a heat transfer surface positioned within the exterior flow channel, and a fan in operative association with the housing for passing a flow of cooling through the exterior flow channel across and over the heat transfer surface of the heat sink structure. In an embodiment, the variable frequency drive heat sink assembly may be mounted to a support plate on a transport refrigeration unit with the tips of the external heat transfer fins in juxtaposition to the support plate. When mounted on a transport refrigeration system, the variable frequency drive heat sink module may be positioned in the path of air flow being drawn through the transport refrigeration unit by a condenser/gas cooler fan.

A method is disclosed for cooling a power electronics module. The method includes the steps of: providing a housing defining an interior chamber for enclosing the power electronics module and defining a flow channel exterior to said interior chamber, providing a heat sink structure having an external heat transfer surface, disposing the external heat transfer surface of the heat sink structure in conductive heat exchange relationship with the interior chamber, and passing a cooling air flow through the flow channel across and over the external heat transfer surface thereby removing heat from the interior chamber through the external heat transfer surface while isolating the power electronics module from the flow of cooling air. The method may further include the step of providing the external heat transfer surface with a plurality of external heat transfer fins extending into the flow channel. The method may include the further step of passing the cooling air flow through the flow channel at an air flow velocity in the range of 4 to 20 millimeters per second per Watt of heat release by the power electronics module.

BRIEF DESCRIPTION OF THE DRAWINGS

For a further understanding of the disclosure, reference will be made to the following detailed description which is to be read in connection with the accompanying drawing, where.

DETAILED DESCRIPTION OF THE INVENTION

Figure 1:
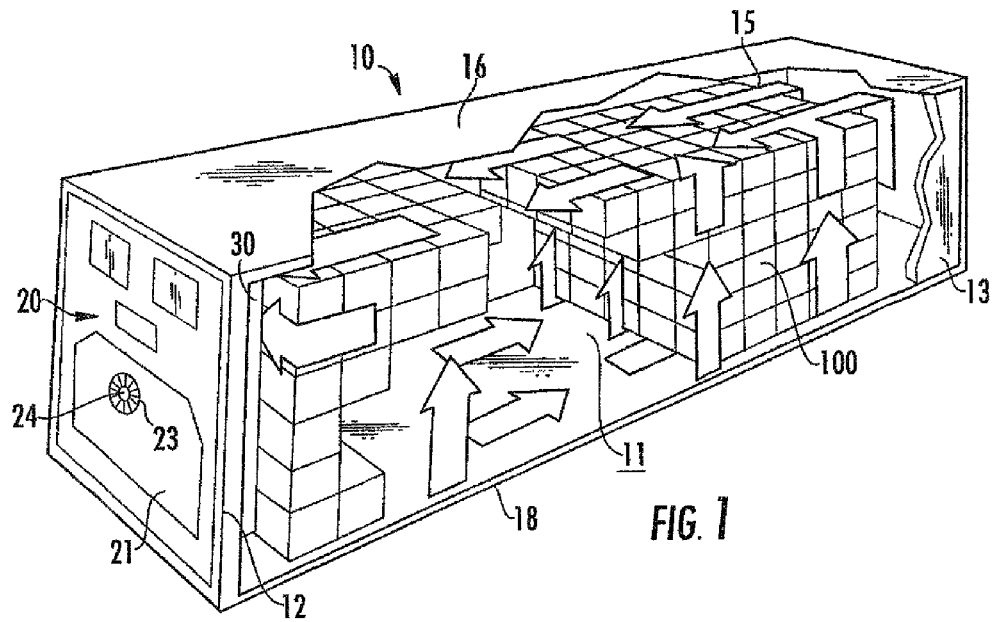
FIG. 1 is a perspective view of a refrigerated transport container, equipped with a refrigeration unit, with a portion of the side wall and ceiling removed.

Referring initially to FIG. 1 of the drawing, there is depicted an exemplary embodiment of a refrigerated cargo container, generally referenced 10, for ship board transport or intermodal transit by ship, rail or road. The cargo container 10 has a box-like structure formed of a forward or front wall 12, a back or rear wall 14, a pair of opposed sidewalls 13 and 15, a ceiling 16 and a floor 18. The box-like structure defines a cargo space, referred to herein as cargo box 11, in which the bins, cartons or pallets of cargo 100 being transported are stacked on the floor 18. The rear wall 14 is provided with one or more doors (not shown) through which access to the cargo box may be provided for loading the cargo into the container 10. When the doors are closed, a substantially air-tight, sealed cargo space is established within the container 10 which prevents inside air from escaping the cargo box 11.

Figure 2:
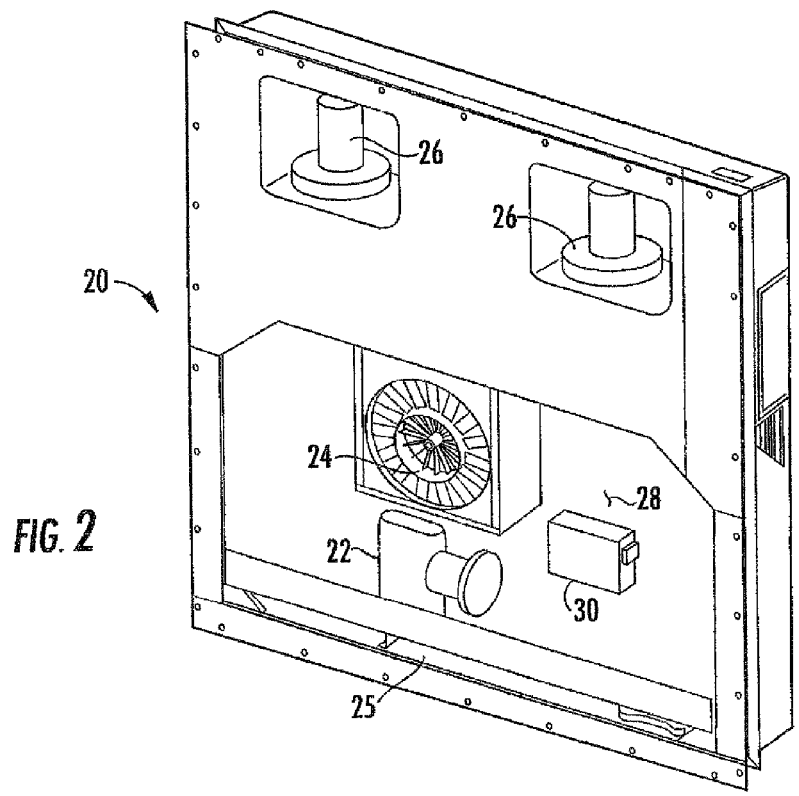
FIG. 2 is a perspective view of the front of the refrigeration unit mounted to the forward wall of the container of FIG. 1.
Figure 3:
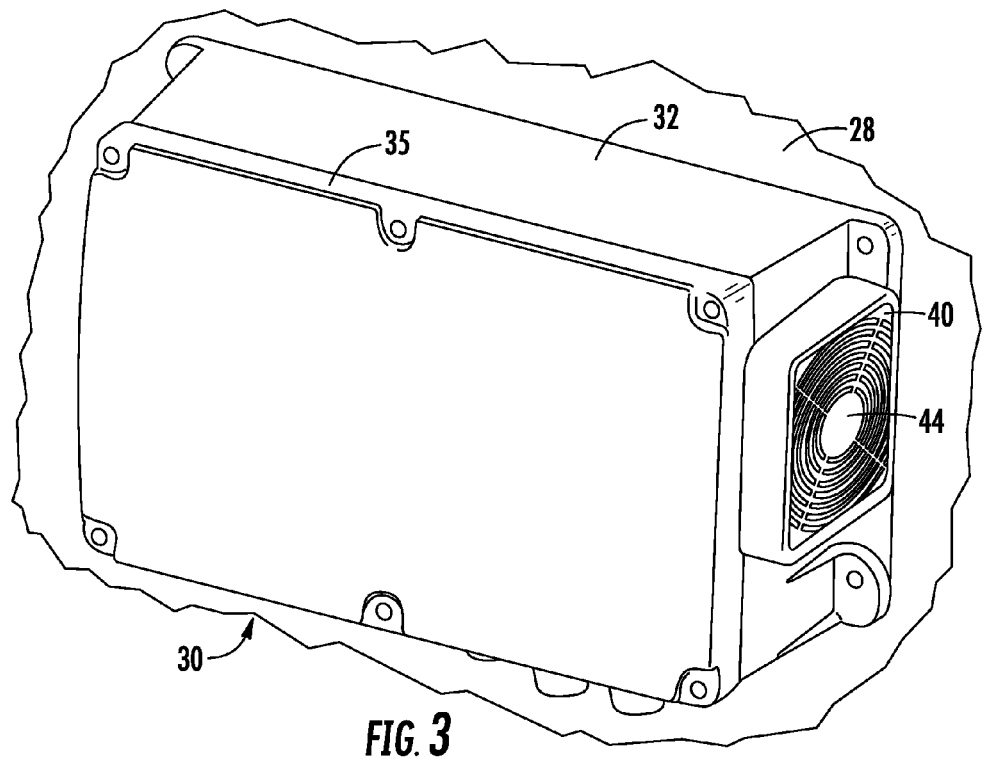
FIG. 3 is a perspective view of an exemplary embodiment of the variable frequency drive heat sink assembly disclosed herein mounted to a support plate of the transport refrigeration unit of FIG. 2.

A transport refrigeration unit 20 is mounted to a wall of the container 10. Generally, the transport refrigeration unit 20 is received in an opening in the forward wall 12 of the container 10 and mounted around its perimeter to the forward wall 12 of the container 10, for example as depicted in FIG. 1, for conditioning the air within the refrigerated chamber, i.e. the cargo box 11 of the container 10. Referring now to FIG. 2 also, the transport refrigeration unit 20 includes a compressor 22 with an associated compressor drive motor, a condenser/gas cooler module (not shown) isolated from the cargo box 11, and an evaporator module including evaporator fan and motor assemblies operatively associated with the cargo box 11 defined within the container 10. The transport refrigeration unit may incorporate various additional components, including but not limited to, a filter-dryer, an expansion device, an intercooler, a receiver, an economizer, a flash tank and various control valves.

The condenser/gas cooler module includes a refrigerant heat rejection heat exchanger (not shown) mounted in the forward section of the refrigeration unit 20 external to the cargo box 11 and positioned generally behind the condense/gas cooler fan 24. The condenser/gas cooler fan 24 draws ambient outdoor air through an opening 25 at the lower front of the refrigeration unit 20, thence passes that air through the condenser/gas cooler heat exchanger behind the front panel 21 and discharges that air back into the outdoor environment. The evaporator fan and motor assemblies 26 draw return air from the cargo box 11, pass the return air and any fresh outdoor air that may be admitted and mixed therewith an evaporator heat exchanger (not shown) for box environment conditioning, and deliver that conditioned air as supply air back into the cargo box 11 of the container 10.

A variable frequency drive heat sink assembly 30 is mounted to the structure of the transport refrigeration unit 20, for example to a support plate 28 behind the front panel 21. The variable frequency drive heat sink assembly 30 is positioned relative to the condenser/gas cooler fan 24 such that a portion of the ambient outdoor air drawn into the unit 20 by the condenser/gas cooler fan 24 passes over the exterior of the variable frequency drive heat sink assembly 30. Although described herein as a variable frequency drive heat sink assembly mounted on a transport refrigeration unit, it is to be understood that the heat sink assembly disclosed herein may be adapted for cooling other power electronics modules in other applications. It is to be understood that application of variable speed drives is not limited to the refrigeration system compressor. For instance, one or more fans or pumps may be driven at a variety of speeds by means of a variable speed drive shared with the compressor or a separate variable speed drive.

Referring now to FIGS. 3-6, there is depicted an exemplary embodiment of the variable frequency drive heat sink assembly 30 disclosed herein. The variable frequency drive heat sink assembly 30 includes a housing 32 defining an interior chamber 34 for enclosing a variable frequency drive module 36 and also defining an exterior flow channel 38. The housing 32 further includes a cooling air inlet opening 40 at a first end of the housing 32 and a cooling air outlet opening 42 at a second end of the housing 32 longitudinally opposite the first end of the housing 32. The housing 32 may have a cover 35 that forms a part of the housing 32 covering the chamber 34 and is releasably secured to the housing 32. The cover 35 may be removed to provide access to the chamber 34 for installing, removing or servicing the variable frequency drive module 36. When the cover 35 is secured to the housing 32, for example by screws, releasable fasteners or the like, an air tight enclosure is provided for protecting the variable frequency drive module 36 and its components from exposure to the cooling air flow.

The variable frequency drive heat sink assembly 30 further includes a cooling air fan 44 for passing cooling air through the exterior flow channel 38. The cooling air fan 44 may be mounted in the cooling air inlet opening 40 or in the cooling air outlet opening 42. In either arrangement, the cooling air fan 44 is operative to draw ambient air from the flow of ambient air that may be at least partially drawn into the transport refrigeration unit 20 by the condenser/gas cooler fan 24. In the depicted embodiment, the cooling air fan 44 is mounted in the cooling air inlet opening 40 and is operative to draw ambient air into and through the inlet duct 45 to and through the exterior flow channel 38 to exit through the cooling air outlet opening 42 at the longitudinally opposite end of the flow channel 38. The cooling air fan 44 can itself be a variable speed fan driven by the variable frequency drive module 36. The speed of the cooling air fan 44 may be changed in response to the measurement of the temperature of the power electronics of the variable frequency drive module 36 and comparison to a threshold temperature. In an embodiment, the condenser/gas cooler fan 24 can provide the cooling air flow through the flow channel 38 for cooling the variable frequency drive module 36.

The variable frequency drive heat sink assembly 30 further includes a heat sink structure defining a heat transfer surface disposed within the exterior flow channel 38 and exteriorly of the chamber 34 enclosing the variable frequency drive module 36. When the cooling air fan 44 is in operation, the cooling air fan 44 passes ambient air through the exterior flow channel 38 across and over the heat transfer surface of the heat sink structure 46 for cooling the power electronics of the variable frequency drive module 36, such as for example, but not limited to, an insulated-gate bipolar transistor (IGBT) or other power semiconductor devices and capacitors. In this manner, the power electronics of the variable frequency drive module 36 may be effectively cooled without being in direct contact with the ambient air thereby avoiding potential corrosion and erosion of the power electronics attendant with direct contact of the power electronics with moist high chlorine content sea air or land air in high humidity conditions.

The heat transfer surface of the heat sink structure may include a plurality of heat transfer fins 48 on the exterior of the housing 32 extending outwardly from the base 50 of the housing 32 into the flow channel 38. The plurality of heat transfer fins 48 may be arrayed in laterally spaced relationship and extend generally longitudinally along the flow channel 38 thereby dividing the flow channel into a plurality of subchannels 52 between the various sets of neighboring heat transfer fins 40.

In an embodiment, each heat transfer fin 48 may extend outwardly to the same extent as the longitudinally extending upper side wall 54 and lower side wall 56 of the housing 32, which define the flow channel 36 therebetween, extend outwardly from base 50 of the housing 32. So constructed, when the variable frequency drive heat sink assembly 30 is mounted to the support plate 28 on the transport refrigeration unit 20, the tip portions of the respective heat transfer fins 48 and the tip portions of the upper and lower side walls 54, 56 of the housing 32 will all contact the surface of the support plate 28.

Figure 4:
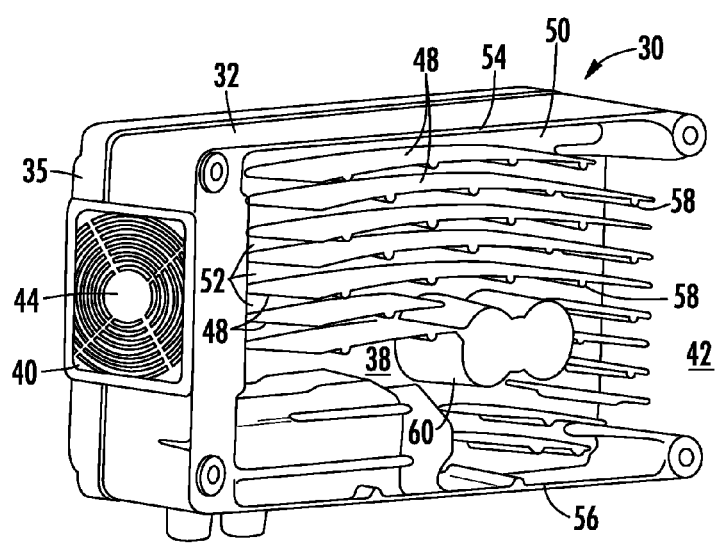
FIG. 4 is a perspective view from the underside of the variable frequency drive heat sink assembly of FIG. 2 removed from the transport refrigeration unit.
Figure 5:
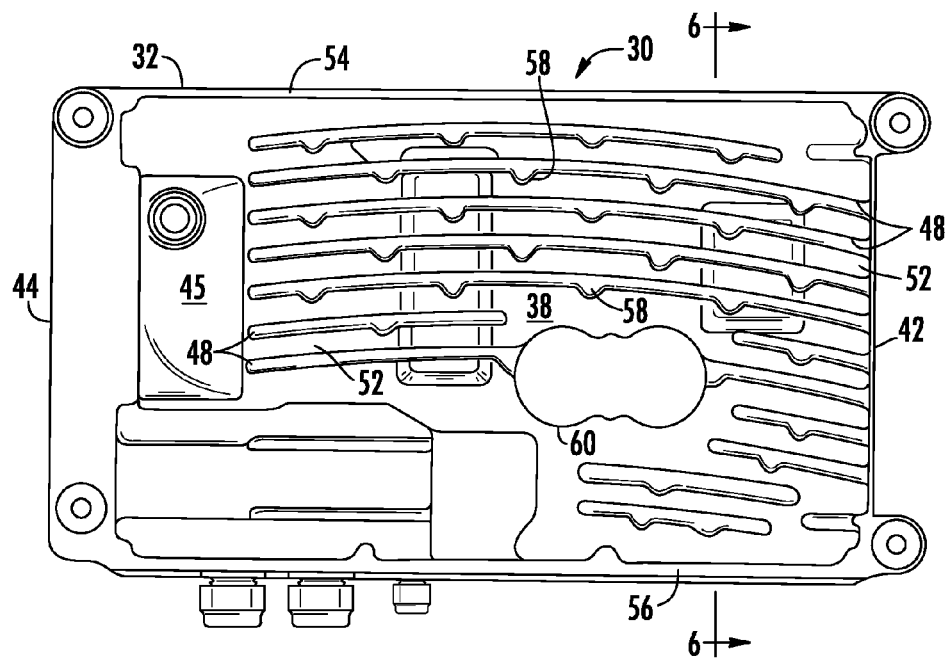
FIG. 5 is a plan view of the underside of the variable frequency drive heat sink assembly of FIG. 4.
Figure 6:
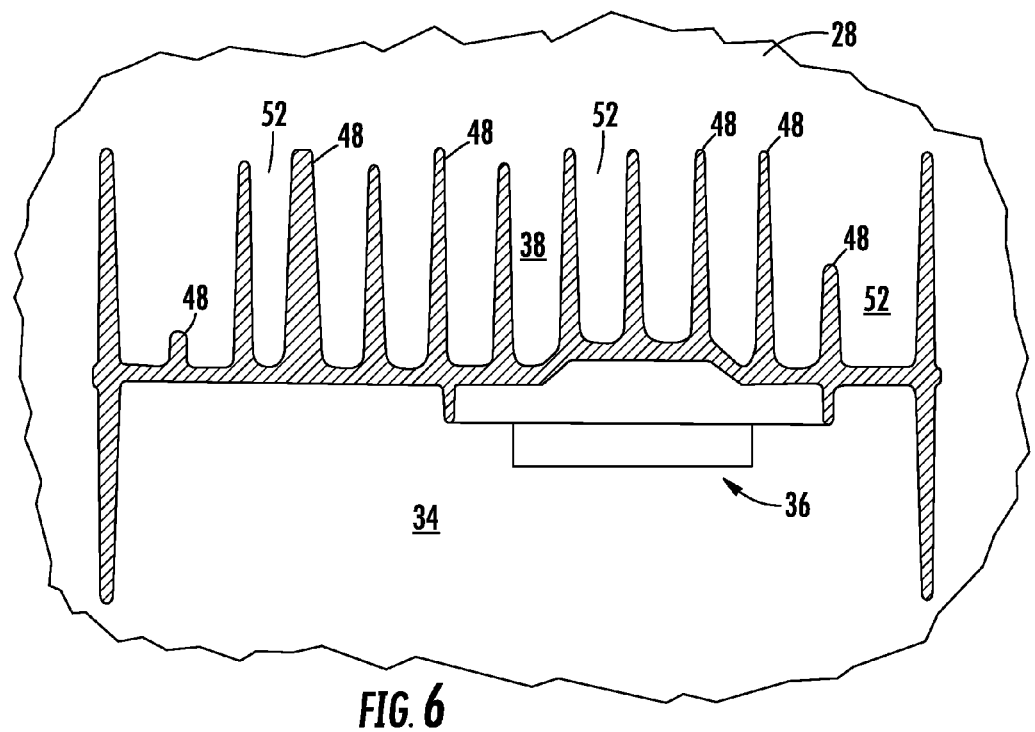
FIG. 6 is a cross-section elevation view of the heat sink structure of the variable frequency drive heat sink assembly of FIG. 5 taken generally along line 6-6.

In the depicted embodiment, the heat transfer fins 48 are arcuate in their longitudinal extent as best seen in FIGS. 4 and 5. The upwardly convex in a vertical plane contour of the arcuate heat transfer fins 48 facilitates drainage of condensate from the surface of the heat transfer fins 48. In an embodiment, the arcuate fins 48 have a nominal curvature radius and a channel length, wherein a ratio of the nominal curvature radius to the channel length has a valve in the range of 0.5 to 3.0, and more narrowly, in the range of 0.8 to 1.5. Condensate may be formed on the surface of the heat transfer fins 48 due to condensation of moisture in the ambient cooling air flowing through the flow channel 38. Additionally, rather than extending outwardly the same extent as the side walls 54, 56 of the housing 32, the heat transfer fins 48 may be foreshortened relative to the upper and lower side walls 54, 56 so as to provide a gap between the tip portions of the heat transfer fins 48 and the support plate 28 when mounted thereto sufficient to allow condensate to drain off the tip portions of the heat transfer fins 48. To further facilitate the drainage of condensate from the surface of the heat transfer fins 48, the plurality of heat transfer fins 48 may be provided with troughs 58 for collecting condensate and draining the collected condensate to the outboard tip portion of the heat transfer fins 48. The troughs 58 may be formed integrally with the heat transfer fins 48.

The housing 32 may be formed of aluminum, aluminum alloy or other material having a relatively high thermal conductivity. The housing 32 may be formed by extrusion or by casting. In the depicted embodiment, the housing 32 comprises a housing cast from aluminum alloy with the heat transfer fins 48 formed integrally with the housing 32 during the casting process. Additionally, in the depicted embodiment, the housing 32 is cast so as to provide capacitor wells 60 which extend outwardly into the flow channel 38 and open to the chamber 34 for receiving capacitors that constitute components of the variable frequency drive module 36.

In the depicted embodiment, the heat transfer fins 48 are formed with an arcuate contour, convex upwardly, in the longitudinal direction which facilitates condensate draining. It is to be understood that in other embodiments, the heat transfer fins 40 may be flat plate fins or wave-like fins extending longitudinally in parallel spaced relationship. Additionally, the heat transfer fins 48 may be of uniform thickness from base to tip or tapered inwardly from base to tip. In an uniform thickness embodiment for example, the heat transfer fins may have a thickness in the range of from 3 to 4 millimeters (0.12 to 0.157 inches) and spaced side to side at a spacing in the range of 10 to 11 millimeters (0.39 to 0.43 inches). In a tapered fin embodiment, which facilitates casting of the housing with the heat transfer fins 48 formed integral with the housing 32, the heat transfer fins 48 may, for example, have a thickness at the fin base in the range of 3 to 4 millimeters (0.12 to 0.157 inches) and inwardly sloping sides having a slope greater than 1 degree and less than 1.5 degree.

According to the method disclosed herein for cooling a power electronics module, heat may be removed from the interior chamber 34 of the housing 32 through the external heat transfer surface 48 while isolating the power electronics module, such as, but not limited to a variable frequency drive 36, from the flow of cooling air. The method includes the steps of: providing a housing 32 defining an interior chamber 34 for enclosing the power electronics module and defining a flow channel exterior 38 to the interior chamber 34; providing a heat sink structure having an external heat transfer surface, including the external heat transfer fins 48; disposing the external heat transfer surface of the heat sink structure in conductive heat exchange relationship with the interior chamber 34; and passing a cooling air flow through the flow channel across and over the external heat transfer surface thereby removing heat from the interior chamber through the external heat transfer surface while isolating the power electronics module from the flow of cooling air. To achieve sufficient convective heat transfer to ensure cooling of the power electronics of the variable frequency drive 36 or other power electronics module to a temperature below a threshold temperature of 85° C. (185° F.) in accord with the method disclosed herein, the cooling air flow may be passed through the flow channel at an air flow velocity in the range of 4 to 20 millimeters per second per Watt of heat release by the power electronics module.

The terminology used herein is for the purpose of description, not limitation. Specific structural and functional details disclosed herein are not to be interpreted as limiting, but merely as basis for teaching one skilled in the art to employ the present invention. Those skilled in the art will also recognize the equivalents that may be substituted for elements described with reference to the exemplary embodiments disclosed herein without departing from the scope of the present invention.

While the present invention has been particularly shown and described with reference to the exemplary embodiments as illustrated in the drawing, it will be recognized by those skilled in the art that various modifications may be made without departing from the spirit and scope of the invention. Therefore, it is intended that the present disclosure not be limited to the particular embodiment(s) disclosed as, but that the disclosure will include all embodiments falling within the scope of the appended claims.

We claim:

1. A heat sink assembly for cooling a power electronics module comprising:
    a housing defining an interior chamber for enclosing the power electronics module and defining a flow channel exterior to said interior chamber; and
    a heat sink structure disposed in conductive heat transfer relationship with said interior chamber and having a heat transfer surface positioned within the exterior flow channel;
    wherein the heat transfer surface comprises a plurality of external heat transfer fins extending outwardly from said housing into the flow channel of the housing;
    wherein the plurality of external heat transfer fins have an arcuate contour in longitudinal expanse.

2. The heat sink assembly as recited in claim 1 wherein said housing further comprises:
    a cooling air inlet opening and a cooling air outlet opening in flow communication with the exterior flow channel; and
    a fan disposed in operative association with the housing for passing a flow of cooling air through the exterior channel across and over the heat transfer surface.

3. The heat sink assembly as recited in claim 2 wherein the fan is disposed in the cooling air inlet opening of said housing.

4. The heat sink assembly as recited in claim 2 wherein the fan is disposed in the cooling air outlet opening of said housing.

5. The heat sink assembly as recited in claim 2 wherein the fan is a variable speed fan.

6. The heat sink assembly as recited in claim 1 wherein the plurality of external fins comprises a plurality of external heat transfer fins that extend outwardly from a base portion of said heat sink structure disposed in conductive heat transfer relationship with said interior chamber to a portion terminating adjacent a bounding wall of said housing.

7. The heat sink assembly as recited in claim 6 wherein the plurality of external heat transfer fins are disposed in spaced relationship thereby defining a plurality of flow subchannels within the flow channel across the heat transfer surface.

8. The heat sink assembly as recited in claim 1 wherein the plurality of external heat transfer fins are formed integral with said housing.

9. The heat sink assembly as recited in claim 1 further comprising a plurality of condensate drain troughs formed in said plurality of external heat transfer fins.

10. The heat sink assembly as recited in claim 1 wherein the plurality of external heat transfer fins are upwardly convex in a vertical plane contour.

11. A variable frequency drive heat sink assembly comprising:
    a variable frequency drive module;
    a housing defining an interior chamber for enclosing the variable frequency drive and defining a flow channel exterior to said interior housing,
    a heat sink structure disposed in conductive heat transfer relationship with said interior chamber and having a heat transfer surface positioned within the exterior flow channel; and
    a fan in operative association with said housing for passing a flow of cooling air through the exterior flow channel across and over the heat transfer surface of the heat sink structure;
    wherein the heat transfer surface comprises a plurality of external heat transfer fins extending outwardly from said housing into the flow channel of the housing;
    wherein the plurality of external heat transfer fins have an arcuate contour in longitudinal expanse.

12. The variable frequency drive heat sink assembly as recited in claim 11 wherein the fan is disposed in the cooling air inlet opening of said housing.

13. The variable frequency drive heat sink assembly as recited in claim 11 wherein the fan is a variable speed fan.

14. The variable frequency drive heat sink assembly as recited in claim 11, wherein the plurality of external heat transfer fins are disposed in spaced relationship thereby defining a plurality of flow subchannels within the flow channel.

15. The variable frequency drive heat sink assembly as recited in claim 11 further comprising a plurality of condensate drain troughs formed in said plurality of external heat transfer fins.

16. The variable frequency drive heat sink assembly as recited in claim 11 wherein the plurality of external heat transfer fins are formed integral with said housing.

17. The variable frequency drive heat sink assembly as recited in claim 11 wherein the variable frequency drive heat sink assembly is used in connection with a transport refrigeration unit.

18. The variable frequency drive heat sink assembly as recited in claim 11 wherein the variable frequency drive heat sink assembly is used in connection with a transport refrigerant unit charged with carbon dioxide refrigerant.

19. The variable frequency drive heat sink assembly as recited in claim 11 wherein the variable frequency drive heat sink assembly is operatively associated with at least one of a compressor, a condenser/gas cooler fan, an evaporator fan, a water pump, and a variable frequency drive cooling fan of a transport refrigeration unit.

20. A method for cooling a power electronics module comprising:
   providing a housing defining an interior chamber for enclosing the power electronics module and defining a flow channel exterior to said interior chamber;
   providing a heat sink structure having an external heat transfer surface, wherein the heat transfer surface comprises a plurality of external heat transfer fins extending outwardly from said housing into the flow channel of the housing, the plurality of external heat transfer fins have an arcuate contour in longitudinal expanse;
   disposing the external heat transfer surface of the heat sink structure in conductive heat exchange relationship with the interior chamber; and
   passing a cooling air flow through the flow channel across and over the external heat transfer surface thereby removing heat from the interior chamber through the external heat transfer surface while isolating the power electronics module from the flow of cooling air.

21. The method as recited in claim 20 further comprising providing the external heat transfer surface with a plurality of external heat transfer fins extending into the flow channel.

22. The method as recited in claim 20 further comprising passing the cooling air flow through the flow channel at an air flow velocity in the range of 4 to 20 millimeters per second per Watt of heat release by the power electronics module.

* * * * *